(12) United States Patent
Lin et al.

(10) Patent No.: US 12,205,909 B2
(45) Date of Patent: Jan. 21, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Da-Jun Lin, Kaohsiung (TW); Bin-Siang Tsai, Changhua County (TW); Fu-Yu Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/138,752

(22) Filed: Apr. 25, 2023

(65) Prior Publication Data

US 2023/0260937 A1 Aug. 17, 2023

Related U.S. Application Data

(62) Division of application No. 17/159,080, filed on Jan. 26, 2021, now Pat. No. 11,676,920.

(51) Int. Cl.
*H01L 23/00* (2006.01)

(52) U.S. Cl.
CPC .............. *H01L 24/05* (2013.01); *H01L 24/45* (2013.01); *H01L 2224/05124* (2013.01); *H01L 2224/45147* (2013.01); *H01L 2224/45464* (2013.01)

(58) Field of Classification Search
CPC ...... H01L 24/05; H01L 24/45; H01L 2224/05124; H01L 2224/45147; H01L 2224/45464; H01L 24/03; H01L 2224/05657; H01L 2224/45664; H01L 2224/48824; H01L 24/48; H01L 24/85; H01L 2224/45565; H01L 2224/48463; H01L 2224/48505; H01L 2224/8592; H01L 2224/85948

See application file for complete search history.

(56) References Cited

U.S. PATENT DOCUMENTS

| | | |
|---|---|---|
| 5,260,234 A | 11/1993 | Long |
| 6,452,271 B2 | 9/2002 | Jiang et al. |
| 6,800,555 B2* | 10/2004 | Test ............... H01L 24/05 438/653 |
| 8,779,344 B2 | 7/2014 | Kao |
| 9,123,789 B2 | 9/2015 | Lin |
| 9,922,948 B2 | 3/2018 | Kuo |
| 9,941,220 B2 | 4/2018 | Hsu |
| 9,960,135 B2 | 5/2018 | Rinck et al. |
| 10,115,582 B2 | 10/2018 | Chen |
| 10,325,876 B2 | 6/2019 | Mathew et al. |
| 11,373,934 B2 | 6/2022 | Oda |
| 2001/0042918 A1 | 11/2001 | Yanagida |
| 2003/0107137 A1* | 6/2003 | Stierman ........... H01L 24/48 257/763 |
| 2005/0001324 A1 | 1/2005 | Dunn et al. |
| 2007/0108633 A1 | 5/2007 | Song et al. |
| 2007/0158199 A1 | 7/2007 | Haight et al. |

(Continued)

*Primary Examiner* — Douglas W Owens
(74) *Attorney, Agent, or Firm* — Winston Hsu

(57) ABSTRACT

A method for fabricating a semiconductor device includes the steps of first forming an aluminum (Al) pad on a substrate, forming a passivation layer on the substrate and an opening exposing the Al pad, forming a cobalt (Co) layer in the opening and on the Al pad, bonding a wire onto the Co layer, and then performing a thermal treatment process to form a Co—Pd alloy on the Al pad.

5 Claims, 2 Drawing Sheets

(56) References Cited

U.S. PATENT DOCUMENTS

| | | |
|---|---|---|
| 2009/0174069 A1 | 7/2009 | Nguyen et al. |
| 2010/0099250 A1 | 4/2010 | Jang et al. |
| 2013/0292820 A1 | 11/2013 | Kang |
| 2019/0109104 A1 | 4/2019 | Dadvand |
| 2021/0043592 A1 | 2/2021 | Park |

* cited by examiner

SEMICONDUCTOR DEVICE AND METHOD FOR FABRICATING THE SAME

CROSS REFERENCE TO RELATED APPLICATIONS

This application is a division of U.S. application Ser. No. 17/159,080, filed on Jan. 26, 2021. The content of the application is incorporated herein by reference.

BACKGROUND OF THE INVENTION

1. Field of the Invention

The invention relates to a method for fabricating semiconductor device, and more particularly to a method for fabricating a cobalt-palladium (Co—Pd) alloy on an aluminum (Al) pad.

2. Description of the Prior Art

Integrated circuits (IC) devices are usually fabricated on semiconductor wafers which have a plurality of IC device die each including bond pads on its top surface that connect to various nodes in the device, such as for signal input, signal output and power supply nodes. The bond pads are generally connected by a bond wire of a lead frame or other electrically conductive structure such as a contact pad on a support such a printed circuit board (PCB) to permit utilization of the IC die. Known methods for connecting an IC device to a lead frame or other support include wire bonding, Tape Automated Bonding (TAB), Controlled Collapse Chip Connection (C4) or bump bonding, and electrically conductive adhesives.

Current approach for wire bonding material typically includes a copper (Cu) wire coated with palladium (Pd). Despite the presence of palladium coating may prevent copper oxidation, a high resistance component commonly referred to as Cu—Al intermetallic compound is still easily formed between the copper wire and aluminum pad interface inducing strong interfacial galvanic corrosion and ultimately resulting in bonding failure. Hence how to improve the current wire bonding technique for minimizing this issue has become an important task in this field.

SUMMARY OF THE INVENTION

According to an embodiment of the present invention, a method for fabricating a semiconductor device includes the steps of first forming an aluminum (Al) pad on a substrate, forming a passivation layer on the substrate and an opening exposing the Al pad, forming a cobalt (Co) layer in the opening and on the Al pad, bonding a wire onto the Co layer, and then performing a thermal treatment process to form a Co—Pd alloy on the Al pad.

According to another aspect of the present invention, a semiconductor device includes an aluminum (Al) pad on a substrate, a wire bonded onto the Al pad, a cobalt (Co) layer between the Al pad and the wire, and a Co—Pd alloy on the Al pad and under the wire.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
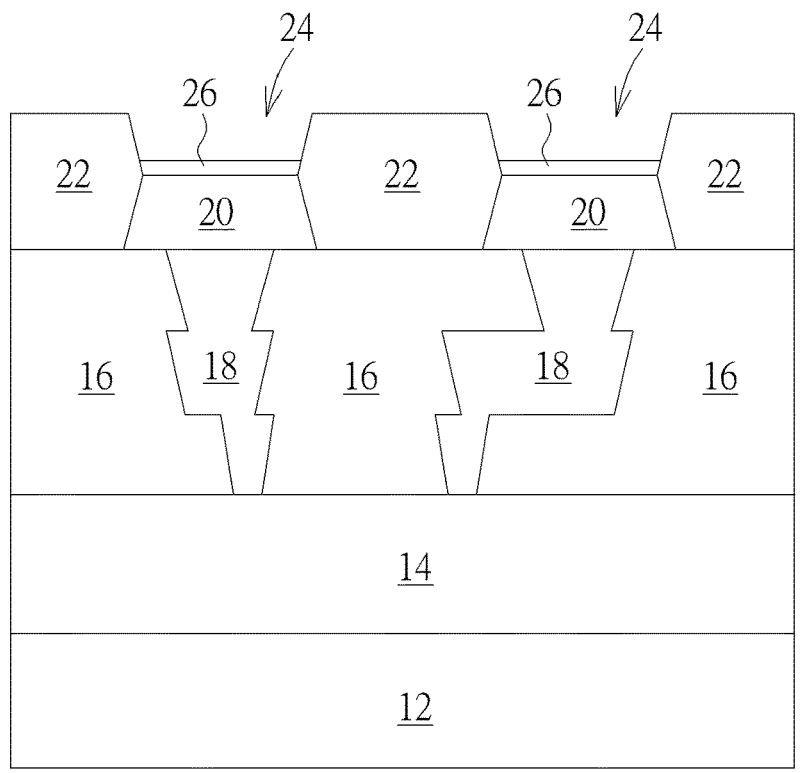
FIGS. 1-3 illustrate a wire bonding process according to an embodiment of the present invention.
Figure 2:
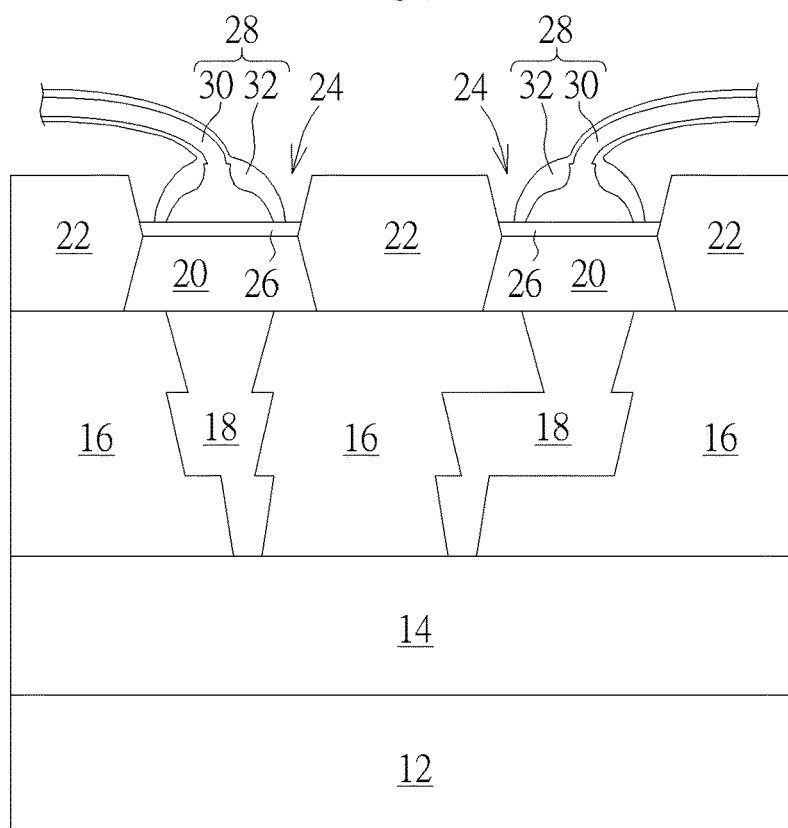
Figure 3:
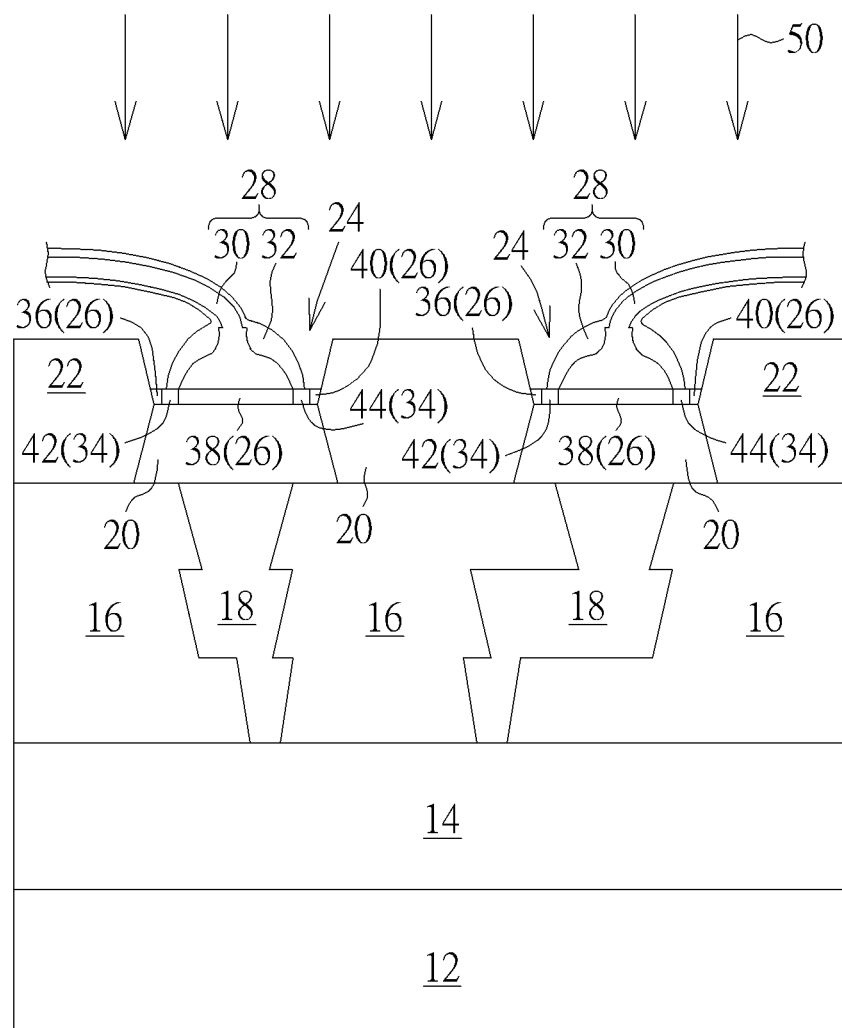

Referring to FIGS. 1-3, FIGS. 1-3 illustrate a method for fabricating a semiconductor device, or more specifically a wire bonding process according to an embodiment of the present invention. As shown in FIG. 1, a substrate 12 such as a semiconductor substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Devices such as metal-oxide semiconductor (MOS) transistors, oxide-semiconductor field-effect-transistors (OS FETs), CMOS transistors, FinFETs, or other active devices could be formed on the substrate 12. At least a dielectric layer such as an inter-layer dielectric (ILD) layer 14 and an inter-metal dielectric (IMD) layer 16 could be formed on the substrate 12 to cover the active devices, in which metal interconnections 18 could be formed within the IMD layer 16 to electrically connect to the active devices on the substrate 12.

Next, a contact pad or more specifically an aluminum (Al) pad 20 is formed on the ID layer 16. Preferably, the formation of the Al pad 20 could be accomplished by first depositing a metal layer made of Al on the surface of the IMD layer 16, and a photo-etching process is conducted to remove part of the metal layer for forming the Al pad 20. Next, a passivation layer 22 is formed on the IMD layer 16 to cover the Al pad 20, and another photo-etching process is conducted to remove part of the passivation layer 22 for forming an opening 24 exposing the surface of the Al pad 20. According to an embodiment of the present invention, the passivation layer 22 can be made with silicon nitride (SiN), silicon dioxide ($SiO_2$), silicon oxynitride (SiON), polyimide, benzocyclobutene (BCB), lead oxide (PBO), or other insulating material. Next, a cobalt (Co) layer 26 is formed in the opening 24 and onto the surface of the Al pad 20.

In addition to the aforementioned approach of first forming the Al pad 20, forming the passivation layer 20 on the Al pad 20, patterning the passivation layer 20 to expose the Al pad 20, and then forming the Co layer 26 on the Al pad 20, according to an embodiment of the present it would also be desirable to first form a metal layer made of Al on the IMD layer 16, form a Co layer on the Al layer, conduct a photo-etching process to pattern the Co layer and Al layer at the same time to form the Al pad 20 and patterned Co layer 26 on the Al pad 20, form a passivation layer 22 on the IMD layer 16 and the Co layer 26, and then conduct another photo-etching process to remove part of the passivation layer 22 for forming an opening 24 exposing the Co layer 26, which is also within the scope of the present invention.

Next, as shown in FIG. 2, a wire bonding process is conducted to form a wire 28 onto the cobalt layer 26. Preferably, the wire bonding process could be accomplished by first coating a palladium (Pd) layer 32 onto the surface of a copper (Cu) wire 30 and then bonding the wire 30 made of the two elements 30, 32 onto the top surface of the cobalt layer 26. Specifically, the coating of the palladium layer 32 is effective in preventing copper oxidation during the bonding process. It should be noted that the area or width of the bottom surface of the wire 28 is substantially less than the area or width of the top surface of the cobalt layer 26 so that after the wire 28 is bonded onto the surface of the cobalt layer 26, there is substantial space or gap between the sidewall of the passivation layer 22 and the outer palladium layer 32 coating.

Next, as shown in FIG. 3, a thermal treatment process 50 is conducted by using thermal budget to transform the interface between the cobalt layer 26 and the palladium layer 32 coating into a Co—Pd alloy 34 on the Al pad 20. Specifically, the thermal treatment process 50 is conducted at a temperature between 250° C. to 350° C. so that the portion of the cobalt layer 26 directly contacting the palladium layer 32 of the wire would react to form a Co—Pd alloy 34.

Preferably, the Co—Pd alloy 34 would form a protective ring or corrosion barrier around the copper portion of the wire 28 if viewed under a top view perspective. Since there is good wettability between the cobalt and copper interface, the copper wire 30 portion of the wire 28 would not react with the cobalt layer 26 hence the portion of the copper wire 30 directly contacting the cobalt layer 26 would not react to form alloy. Moreover as the copper wire 30 portion of the wire 28 is enclosed by the Co—Pd alloy 34 ring so that the copper wire 30 does not contact the Al pad 26 underneath directly, no high resistance Cu—Al intermetallic compound would be formed in the center area of the Al pad 26 and issues such as galvanic corrosion and bonding failure could be prevented effectively.

Referring again to FIG. 3, the Co—Pd alloy 34 ring formed through the aforementioned process also divides the cobalt layer 26 into a first portion 36, a second portion 38, and a third portion 40 if viewed from a cross-section perspective and the Co—Pd alloy 34 ring itself could further include a first Co—Pd alloy 42 between the first portion 36 and the second portion 38 and a second Co—Pd alloy 44 between the second portion 38 and the third portion 40 or if viewed from another perspective the Co—Pd alloy 34 is disposed to surround the second portion 38.

Overall, the present invention provides an approach of first forming a cobalt layer on an Al pad, bonding a wire made of copper wire with palladium layer coating onto the surface of the cobalt layer, and then performing a thermal treatment process to form a Co—Pd alloy on the Al pad. Preferably, the high potential Co—Pd alloy formed on the Al pad and under the wire could serve as a protective seal ring or corrosion and oxidation barrier to prevent formation of high resistance Cu—Al intermetallic compound in the center area of the Al pad and issues such as galvanic corrosion and bonding failure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   forming an aluminum (Al) pad on a substrate;
   forming a cobalt (Co) layer on the Al pad;
   bonding a wire onto the Co layer, wherein the wire comprises a copper (Cu) wire and a palladium (Pd) layer coated on the Cu wire; and
   performing a thermal treatment process to form a Co—Pd alloy on the Al pad and divide the Co layer into a first portion, a second portion, and a third portion.

2. The method of claim 1, further comprising:
   forming a passivation layer on the substrate, wherein the passivation layer comprises an opening exposing the Al pad; and
   forming the Co layer in the opening onto the Al pad.

3. The method of claim 1, wherein the thermal treatment process is between 250° C. to 350° C.

4. The method of claim 1, wherein the Co—Pd alloy surrounds the second portion.

5. The method of claim 1, wherein the Co—Pd alloy comprises:
   a first Co—Pd alloy between the first portion and the second portion; and
   a second Co—Pd alloy between the second portion and the third portion.

* * * * *